(12) United States Patent
Schatzberger et al.

(10) Patent No.: US 8,325,538 B2
(45) Date of Patent: Dec. 4, 2012

(54) CIRCUIT ARRANGEMENT WITH A COLUMN LATCH AND METHOD FOR OPERATING A COLUMN LATCH

(75) Inventors: Gregor Schatzberger, Graz (AT); Andreas Wiesner, Edelschrott (AT)

(73) Assignee: Austriamicrosystems AG, Unterpremstatten (AT)

( * ) Notice: Subject to any disclaimer, the term of this patent is extended or adjusted under 35 U.S.C. 154(b) by 132 days.

(21) Appl. No.: 12/884,075

(22) Filed: Sep. 16, 2010

(65) Prior Publication Data
US 2011/0063921 A1   Mar. 17, 2011

(30) Foreign Application Priority Data
Sep. 17, 2009   (DE) .......................... 10 2009 041 935

(51) Int. Cl.
*G11C 7/00*   (2006.01)
(52) U.S. Cl. .................. 365/189.05; 365/63; 365/230.08
(58) Field of Classification Search ............. 365/189.05, 365/230.08, 63
See application file for complete search history.

(56) References Cited

U.S. PATENT DOCUMENTS

| | | | |
|---|---|---|---|
| 6,714,450 B2 | 3/2004 | Bertrand et al. | |
| 6,859,391 B1* | 2/2005 | Combe et al. | 365/185.05 |
| 6,937,510 B2* | 8/2005 | Hosono et al. | 365/185.03 |
| 7,126,860 B2* | 10/2006 | Pratlong et al. | 365/189.05 |
| 2007/0195609 A1 | 8/2007 | Kim et al. | |

* cited by examiner

*Primary Examiner* — Son Dinh
(74) *Attorney, Agent, or Firm* — Cozen O'Connor

(57) ABSTRACT

In one embodiment, a circuit arrangement with a column latch has a first terminal (A1) for connection to a bit line (BL) of a nonvolatile memory, a second terminal (A2) connected via a first switchable path (P1) to a reference-potential terminal (VSS) and via a second switchable path (P2) to a supply-potential terminal (VPP), and the column latch (100, 110), which is coupled to the second terminal (A2) and is adopted for storing a potential at the second terminal (A2). The first terminal (A1) is coupled to the second terminal (A2) via a first switchable connection (L1) and via a second switchable connection (L2). A method for operating a column latch is additionally disclosed.

15 Claims, 5 Drawing Sheets

CIRCUIT ARRANGEMENT WITH A COLUMN LATCH AND METHOD FOR OPERATING A COLUMN LATCH

RELATED APPLICATIONS

This application claims priority of German application no. 10 2009 041 935.7 filed Sep. 17, 2009, the entire content of which is hereby incorporated by reference.

FIELD OF THE INVENTION

The present invention is related to a circuit arrangement with a column latch and to a method for operating a column latch.

BACKGROUND OF THE INVENTION

State memory elements are conventionally referred to as registers, latches or column latches and are used for an efficient driving of nonvolatile memories such as EEPROMs or flash memories. A nonvolatile memory can retain its data even if the supply voltage has been turned off. In comparison to volatile memories, also referred to as RAMs, the programming or writing of EEPROM or flash memories is relatively slow. The so called hot carrier charge injection method or the Fowler-Nordheim tunneling mechanism is typically used for programming EEPROMs or flash memories. The column latch described below is designed for use together with EEPROM or flash memories that are programmed and erased with the Fowler-Nordheim tunneling mechanism. To operate such a memory efficiently, it is subdivided into areas several bytes wide, so-called pages. The memory cells of a page are accessible via the latch with only one write or read operation. The latches are implemented with high-voltage transistors.

The circuit arrangement proceeds from a circuit in which a latch is connected via a switch to a bit line of a nonvolatile memory cell. To program the memory cell, a corresponding value is first written into the latch. This writing to the latch takes place with low supply voltages. However, since the starting or threshold voltage of the high-voltage transistors in the latch is higher than that for low-voltage transistors, and the on-state resistance of the aforementioned switch increases sharply for a low supply voltage, for example, into the range of several 100 kiloohms, it is problematic to reliably store a value in the latch. Due to the high on-state resistance at low supply voltages, even small currents that cause a voltage drop at the on-state resistance are sufficient to prevent the voltage from reliably exceeding or falling below the switching point of the latch. This property intensifies at low temperatures, whereby the threshold voltage of the high-voltage transistors, and thus the on-state resistance of the switch, increase further. To reduce the on-state resistance, the geometry of the switch would have to be enlarged to such an extent that the latch could no longer be constructed in a spatially efficient manner and would additionally represent a very high capacitive load for a data driver connected to it.

SUMMARY OF THE INVENTION

One object of the invention is to provide a circuit arrangement with a column latch that is improved with regard to the above, and an improved method for operating a column latch.

In one embodiment, a circuit arrangement with a column latch comprises a first terminal, a second terminal and the column latch. The first terminal is designed for connection of the column latch to a bit line of a nonvolatile memory cell. The second terminal is connected via a first switchable path to a reference-potential terminal and via a second switchable path to a supply-potential terminal. The column latch is coupled to the second terminal and designed for storing a potential at the second terminal. The first terminal is coupled to the second terminal via a first switchable connection and via a second switchable connection.

By switching on the first and second switchable connections, the first terminal is coupled to the second terminal. A data element supplied via the bit line is stored in the column latch by means of the first and second switchable paths.

The parallel switching of the first and second switchable connections together with the first and second switchable paths advantageously allows a lower on-state resistance, so that a data element is reliably stored in the column latch even if the circuit arrangement is operated with low voltages.

The bit line forms the connection of the column latch to at least one cell of a nonvolatile memory such as an EEPROM or flash memory. The column latch is loaded via the bit line and the first terminal with a data element or a value that subsequently serves as the basis for a programming process.

A data element or a value is either a logical 0 or logical 1. For example, a logical 0 is represented by reference potential and a logical 1 by supply potential.

Low voltages or a low-voltage operation or a low-voltage range refer to a range from 0 to 5.5 V. A high-voltage range refers to a range from 0 to ca. 15 V. High voltages or a high-voltage operation are referred to correspondingly.

The first and second switchable connections and the first and second switchable paths each comprise a switch. A switchable connection or a switchable path is switched on by closing the respective switch. A switchable connection or a switchable path is switched off by opening the respective switch. A switch is constructed in the form of a transistor or in the form of a transmission gate, having two transistors in a parallel connection.

In one refinement, the first and second switchable connections can be switched without current as a function of a load signal.

In the presence of the load signal, the first and second switchable connections are switched on. No direct current flows in this case, which enables a reliable writing of the column latch.

The first and second switchable connections are preferably switched on or off simultaneously.

In another embodiment, the first and second switchable paths can each be switched without current in the presence of the load signal, depending on a potential at the first terminal, to load a value corresponding to the potential at the second terminal into the column latch, or in the presence of the inverted load signal, to hold the last loaded value in the column latch.

In the presence of the load signal, the first or second switchable path is switched on corresponding to the potential at the first terminal, in addition to the first and second switchable connections. The resultant value of the potential at the second terminal is loaded into the column latch. Loading is ended with the inverted load signal. The first and second switchable paths and the first and second switchable connections are switched off. The last loaded value is held in the column latch.

The switching of the first and second switchable paths and the first and second switchable connections without current advantageously enables a reliable loading or writing of the column latch, even at low supply voltages and over a wide temperature range.

Loading takes place in low-voltage operation. The supply-potential terminal is connected for this purpose to a supply voltage from the low-voltage range.

In one refinement, the first terminal is connected via a third switchable connection to a read-potential terminal for recharging the bit line as a function of a readout signal.

In the presence of the readout signal, the third switchable connection is switched on. The first terminal is connected to the read-potential terminal. Thereby the potential of the bit line is matched to the read potential.

By means of the recharging of the bit line, a readout of data from the connected memory cell is advantageously accelerated at low voltages over a large temperature range.

The recharging of the bit line is also referred to as precharging. The read potential is adapted to the topology or the switching threshold of a readout circuit used in connection with the nonvolatile memory.

In one refinement, the column latch is switchably coupled for a reset to the reference-potential terminal as a function of a reset signal.

In the presence of the reset signal, the column latch is brought into a defined state by connection to the reference-potential terminal. The defined state can be a logical 0 or a logical 1.

In one refinement, the first terminal is switchably coupled to the reference-potential terminal as a function of a programming signal and is designed for programming the nonvolatile memory cell.

The first terminal is coupled to the reference-potential terminal by applying the programming signal. The nonvolatile memory cell connected via the bit line is programmed independently of the contents of the column latch. For programming, the column latch is operated in the high-voltage range via the supply-potential terminal.

In another embodiment, the first terminal is switchably coupled via an erase inverter to the second terminal as a function of an erase signal and an inverted erase signal, and is designed to erase the nonvolatile memory cell as a function of the potential at the first terminal.

The nonvolatile memory cell is erased depending on the value most recently stored in the column latch, i.e., depending of the potential at the first terminal. For this purpose, the erase inverter is connected between the first and second terminals in the presence of the erase signal and the absence of the inverted erase signal, whereby the value stored in the column latch is supplied to the bit line. If the column latch contains, for example, a logical 1, then the connected memory cell is erased. If the column latch was loaded with a logical 0, then the nonvolatile memory cell is not erased. The erasing also takes place in high-voltage operation.

In another embodiment, the column latch comprises a first inverter and a second inverter. An output of the first inverter is coupled to the second terminal and to an input of the second inverter. An output of the second inverter is coupled to an input of the first inverter.

A supply voltage of the first and second inverters can be switched between a first supply potential and a second supply potential. The first supply potential lies in the high voltage range, and the second supply potential lies in the low voltage range.

In one refinement, the circuit arrangement comprises a third terminal. The latter is switchably connected via an additional inverter to the output of the second inverter. In addition, the third terminal is switchably connected to the first terminal and is designed for connection of an inverted bit line of a differentially constructed nonvolatile memory cell.

In a differential construction of the connected memory cell, one data bit is represented by two memory bits. The two memory bits have mutually inverted states. If there is a differential design of the memory cell, then the bit line is connected to the first terminal and the inverted bit line is connected to the third terminal.

In one refinement, the third terminal is switchably connected as a function of the readout signal to the read-potential terminal and switchably connected to the first terminal. The third terminal is additionally designed for recharging the inverted bit line.

An application of the read signal brings about a connection between the first and the third terminal and simultaneously a connection of these two terminals to the read-potential terminal. Thereby both the bit line and the inverted bit line are recharged or precharged to the read potential.

Thereby a readout of the contents of the connected, differentially constructed memory cell is advantageously accelerated.

In another embodiment, the third terminal is switchably coupled to the reference-potential terminal as a function of the programming signal and is designed for programming the nonvolatile memory cell.

Both the first and the third terminal are connected to the reference-potential terminal in order to program the connected, differentially constructed nonvolatile memory cell. The programming is done, as described above, in high-voltage operation, independently of the contents in the column latch. For this purpose a voltage from the high-voltage range is fed to the supply-potential terminal.

In one refinement, the third terminal is coupled as a function of the erase signal and the inverted erase signal to the second terminal via the additional inverter. The third terminal here is designed for erasing the nonvolatile memory cell as a function of the potential at the third terminal.

When the erase signal is applied, an inverted value of the column latch is supplied via the additional inverter to the third terminal. Depending on this value, the connected memory cell is erased or remains programmed, as described above.

In another embodiment, the first and the third terminals are each switchably connected as a function of an erase test signal to the supply-potential terminal.

The erase test signal is applied to test the data-holding capacity of the differentially constructed nonvolatile memory cell. The first and the third terminals are connected to the supply-potential terminal. Thereby both cells of the differentially constructed memory are erased independently of the contents of the column latch. A subsequent readout of the contents of the memory cells allows a check of the data-holding capacity of the memory. This test is referred to as data retention bake.

BRIEF DESCRIPTION OF THE DRAWINGS

The invention will be described in detail below for several embodiments with reference to the figures. Components and circuit elements that are functionally identical or have the identical effect bear identical reference numbers. Insofar as circuit parts or components correspond to one another in function, a description of them will not be repeated in each of the following figures. Therein.

DETAILED DESCRIPTION OF THE DRAWINGS

Figure 1:
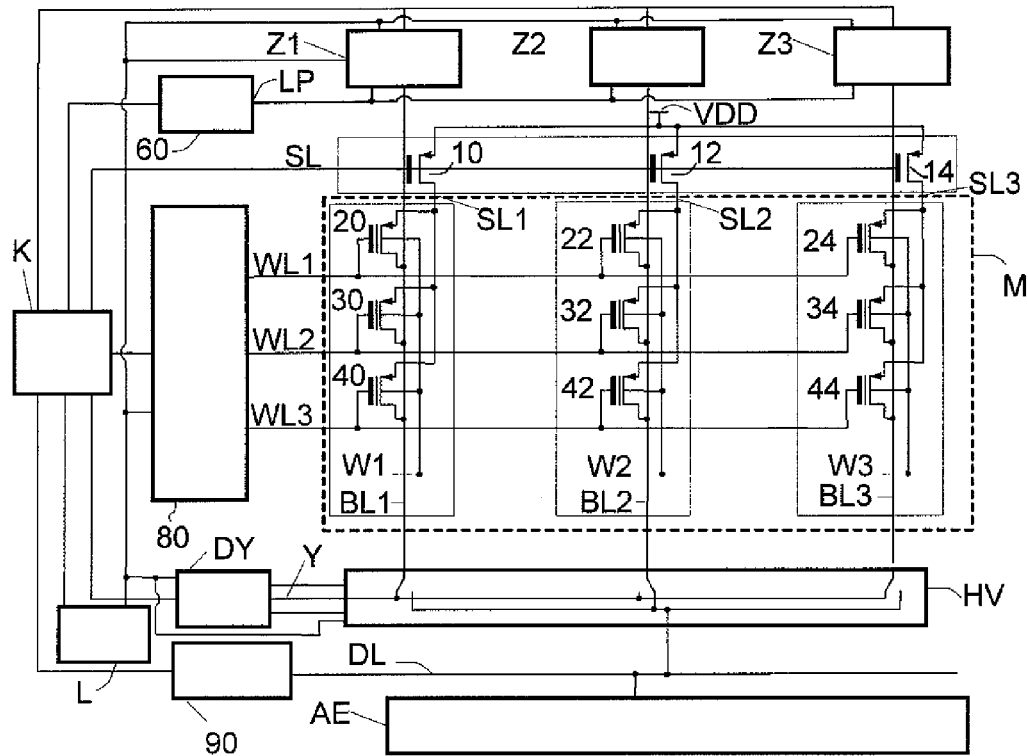
FIG. 1 shows a first embodiment of a nonvolatile memory.

FIG. 1 shows a first embodiment of a nonvolatile memory. The nonvolatile memory, such as an EEPROM memory, comprises a memory matrix M, a control logic unit K, a read-potential generator 60, an X decoder 80, a data driver 90, a Y decoder DY, a readout unit AE, a charge pump L, selection transistors 10, 12, 14 and column latches Z1, Z2 and Z3. The X decoder 80, the Y decoder DY, the read-potential generator 60, the data driver 90 and the column latches Z1, Z2 and Z3 are each coupled to the control logic unit K. The selection transistors 10, 12 and 14 are coupled via a common control line SL at their respective control terminal to the control logic unit K. The data driver 90 is linked via a data line DL to the readout unit AE. The data line DL is switchably connected to an output Y of the Y decoder DY. This switchable connection is realized, for example, by means of high-voltage transmission gates HV. The output Y forms a write-potential terminal VW (see FIG. 2). A write voltage is provided at the output Y of the Y decoder DY. An output of the read-potential generator 60 is respectively coupled to the column latch Z1, Z2 and Z3. The output of the read-potential generator 60 forms the read-potential terminal LP at which a read voltage is provided.

One input of the charge pump L is coupled to the control logic unit K. One output of the charge pump L is connected to the Y decoder DY, the X decoder 80, to the column latches Z1, Z2 and Z3, and to the high-voltage transmission gates of the switchable connection between the data line DL and the output Y.

The 3*3 memory matrix M comprises transistors 20, 22, 24, 30, 32, 34, 40, 42 and 44. Each data bit of the memory matrix M is implemented in this example by one memory cell, i.e. by a transistor. Each control input of the transistors 20, 22 and 24 is connected via a first word line WL1 to the X decoder 80. Each control input of the transistors 30, 32 and 34 is connected via a second word line WL2 to the X decoder 80. Each control input of the transistors 40, 42 and 44 is connected via a third word line WL3 to the X decoder 80.

Each well terminal of the transistors 20, 30 and 40 is connected to a first well terminal W1. A well terminal is also referred to as a bulk terminal. Each well terminal of the transistors 22, 32 and 42 is connected to a second well terminal W2. Each well terminal of the transistors 24, 34 and 44 is connected to a third well terminal W3. Each drain terminal of the transistors 20, 30 and 40 is coupled via a first bit line BL1 to the column latch Z1. The first bit line BL1 is also switchably connected to the output Y of the Y decoder DY. Each source terminal of the transistors 20, 30 and 40 is connected via a first selection line SL1 to the drain terminal of the selection transistor 10.

Correspondingly, the respective drain terminals of the transistors 22, 32 and 42 are connected via a second bit line BL2 to the column latch Z2. The second bit line BL2 is switchably coupled to the Y output of the Y decoder DY. The respective source terminals of the transistors 22, 32 and 42 are connected via a second selection line SL2 to a drain terminal of the selection transistor 12.

Each drain terminal of the transistors 24, 34 and 44 is connected via a third bit line BL3 to the column latch Z3. The third bit line BL3 is switchably connected to the output Y of the Y decoder DY. Each source terminal of the transistors 24, 34 and 44 is connected via a third selection line SL3 to the drain terminal of the selection transistor 14. Each source terminal of the transistors 10, 12 and 14 is connected to a supply-potential terminal VDD.

A transistor of the memory matrix M is also referred to as a memory cell.

The control logic unit K, the selection unit AE, and the data driver 90 are each implemented based on low-voltage transistors. A respective driver stage of the X decoder 80 and the Y decoder DY, as well as the memory matrix M, the charge pump L, the selection transistors 10, 12 and 14 and the column latches Z1, Z2 and Z3 are each implemented on the basis of high-voltage transistors. Thereby the programming and erasing of the transistors in the memory matrix M with the aid of the Fowler-Nordheim tunneling mechanism is made possible. The charge pump L brings about a raising of the supply potential of a column latch from the low-voltage range to the high-voltage range. The mode of operation of the illustrated nonvolatile memory, as well as the structure and function of the column latches, will be described further with reference to FIG. 2.

Figure 2:
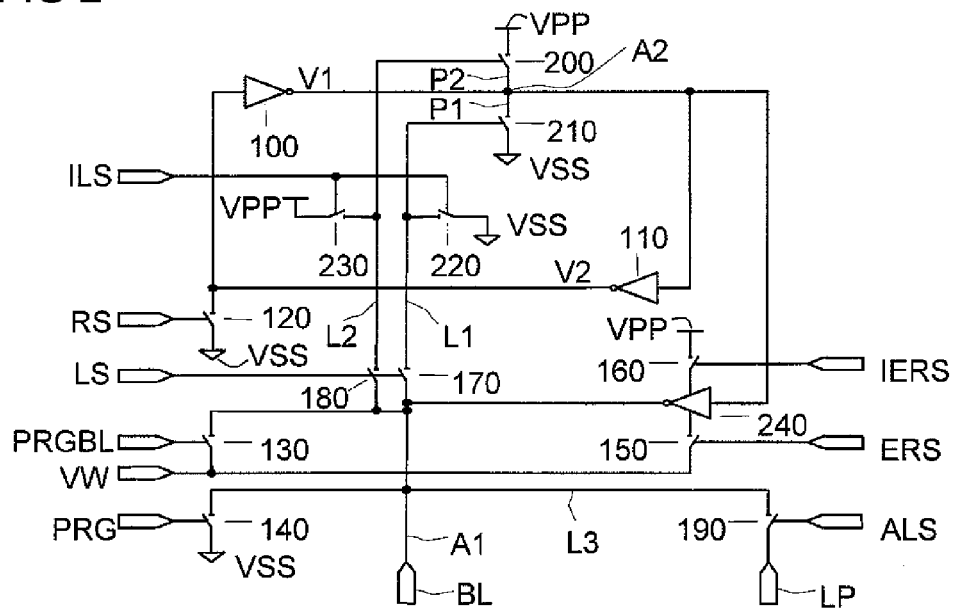
FIG. 2 shows a first example embodiment of a circuit arrangement according to the invention.

FIG. 2 shows a first example embodiment of a circuit arrangement according to the invention. The circuit arrangement comprises a column latch 100, 110, an erase inverter 240, a first terminal A1, a second terminal A2, a reference-potential terminal VSS, a supply-potential terminal VPP, a first, a second and a third switchable connection L1, L2, L3, a first and a second switchable path P1, P2, a write-potential terminal VW, a read-potential terminal LP, as well as several inputs for supplying signals. The circuit arrangement is coupled via these inputs to the control logic unit K of the memory from FIG. 1.

The column latch 100, 110 comprises a first inverter 100 and a second inverter 110. An output of the first inverter 100 is connected to an input of the second inverter 110 as well as to the second terminal A2. An output of the second inverter 110 is connected to an input of the first inverter 100.

The embodiment of the circuit arrangement shown in FIG. 2 is one possible implementation of the column latches Z1, Z2 and Z3, respectively, from FIG. 1, for example.

The first terminal A1 is designed for connection to a bit line BL. The bit line BL can thus be connected, for example, to the first bit line BL1 from FIG. 1. The column latch 100, 110 then corresponds to the column latch Z1 from FIG. 1. The first terminal A1 is coupled via the first and the second switchable connections L1 and L2 and the first or second switchable path P1 or P2 to the second terminal A2. The first switchable connection L1 has a switch 170. The second switchable connection L2 has a switch 180. The first switchable path P1 comprises a switch 210, and the second switchable path P2 comprises a switch 200. The switch 210 of the first switchable path P1 is controlled by the first switchable connection L1. The switch 200 of the second switchable path P2 is controlled by the second switchable connection L2. The switch 170 of the first switchable connection L1 and the second switch 180 of the second switchable connection L2 are each controlled by a load signal LS.

In addition, the first switchable connection L1 is switchably connected to the reference-potential terminal VSS via a switch 220 controlled by an inverted load signal ILS. The second switchable connection L2 is switchably connected to the supply-potential terminal VPP via a switch 230 controlled by the inverted load signal ILS.

The input of the first inverter 100 is switchably connected to the reference-potential terminal VSS via a switch 120 that is controlled by a reset signal RS.

The first terminal A1 is connected via a switch 140, controlled by a programming signal PRG, to the reference-potential terminal VSS. Furthermore, the first terminal A1 is connected via a switch 130, controlled by a protection signal PRGBL, to the write-potential terminal VW. An input of the erase inverter 240 is connected to the second terminal A2. An output of the erase inverter 240 is connected to the first terminal A1. A positive supply terminal of the erase inverter 240 is connected via a switch 160, controlled by an inverted erase signal IERS, to the supply-potential terminal VPP. A negative supply terminal of the erase inverter 240 is connected via a switch 150, controlled by an erase signal ERS, to the write-potential terminal VW. The first terminal A1 is connected via the third switchable connection L3 to a read-potential terminal LP. The third switchable connection L3 has a switch 190 that is controlled by a readout signal ALS.

The process described below, which comprises resetting, loading, programming and erasing as well as subsequently resetting, takes place under the control of the control logic unit at predetermined points in time.

For resetting the column latch 100, 110, the switch 120 is closed with the aid of the reset signal RS each time the supply voltage is switched on and after each writing process in the memory, and the column latch 100, 110 is preset. The output of the second inverter 110 is thus switched to the potential of the reference-potential terminal VSS, and the output of the first inverter 100 a switched to the potential of the supply-potential terminal VDD.

To load the column latch 100, 110, the switches 120, 130, 140, 150, 160 and 190 are opened with the aid of the programming signal PRG, the protection signal PRGBL, the reset signal RS, the erase signal ERS, the inverted erase signal IERS and the readout signal ALS. The switches 170 and 180 are closed with the aid of the load signal LS. The switches 220 and 230 are opened with the aid of the inverted load signal ILS. Thus the first terminal A1 has a connection via the bit line BL to the data driver 90 from FIG. 1. The supply-potential terminal VPP is connected to the supply-potential terminal VDD, so that the circuit is operated in the low-voltage range during loading.

If a logical 1 is to be written into the column latch 100, 110, then the output stage of the data driver 90 goes to the potential of the supply-potential terminal VDD. The potential of the bit line BL is likewise pulled to the potential of the supply-potential terminal VDD and switches on the first switchable path P1 via the switch 210. The second switchable path P2 remains off due to the opened switch 200. The output of the first inverter 100 is thus connected to the reference-potential terminal VSS. When a switching threshold of the second inverter 110 is reached, the output of the second inverter 110 switches to the potential of the supply-potential terminal VDD. The column latch 100, 110 is latched. This state is retained so long as the potential of the bit line BL is not pulled below the switching point of the switches 200 and 210.

If a logical 0 is to be stored in the column latch 100, 110, then the output of the data driver 90 is connected to the reference-potential terminal VSS. Thereby the switch 200 is closed; the switch 210 remains opened.

The output of the first inverter 100 is switched to the potential of the supply-potential terminal VPP. As soon as the switching threshold of the second inverter 100 is exceeded, the output of the second inverter 110 switches to the potential of the reference-potential terminal VSS and the column latch 100, 110 is latched.

After the loading has finished, i.e. when the column latch 100, 110 has latched, the switches 170, 180 are opened with the aid of the load signal LS. These switches 220 and 230 are closed with the aid of the inverted load signal ILS. This leads to the opening of the switches 200 and 210. Thereby the most recent state of the data driver 90 is stored in the column latch 100, 110.

To program a memory cell, the data and the address of this memory cell are first applied to the memory matrix M. The X decoder 80 and the Y decoder DY select the address to be written to. The high-voltage transmission gates are closed, so that the data of the data driver 90 is loaded via the data line DL into the column latch. A memory cell is programmed after termination of the loading of the column latch. The programming comprises a programming cycle and a subsequent erase cycle. For this purpose, a voltage in the range of 14 V is required. The charge pump L of the memory generates this voltage. In order to bring the right potentials for the programming or erasing cycle to the memory cell, the supply voltage for the inverters 100 and 110 is switched to the high voltage generated by the charge pump L. In addition, the supply-potential terminal VPP is disconnected from the supply-potential terminal VDD, so that the circuit is operated in the high-voltage range. Depending on the state that is stored in the column latch, the output of the second inverter is switched to the potential of the high-voltage in case of a stored logical 1, and the output of the first inverter 100 is switched to reference potential. If a logical 0 is stored in the column latch 100, 110, the potential at the output of the second inverter 110 is switched to reference potential and the potential at the output of the first inverter 100 is switched to the high voltage. During the programming and erasing cycle, the switchable connection between the readout unit AE and the data driver 90 is broken by opening the high-voltage transmission gates in order to protect the low-voltage transistors of these units from the high voltage. The selection transistors 10, 12 and 14 from FIG. 1 are opened via the control line SL, in order to suppress a drain/source current during a programming and erasing cycle.

For example, to write a logical 0 to the transistor 32 of the memory matrix M in FIG. 1, the column latch Z2 is loaded with a 1. In the programming cycle, the second word line WL2 is switched to the positive supply voltage, and the first and third word lines WL1 and WL3 are each switched to the reference potential. The second well terminal W2 is at reference potential; the first and the third well terminals W1 and W3 are at supply potential. The column latches Z1 and Z3 from FIG. 1 are preloaded with a logical 0, generated by the reset signal RS. The positive supply voltage is pulled to the potential of the high voltage with the aid of the charge pump L. The switch 140 is turned on with the aid of the programming signal PRG, and the potential of the bit line BL is switched to the reference potential. In order to protect the transistors 20, 40, 24 and 44 from unintended programming, the column latches Z1 and Z3 from FIG. 1 are pulled with the aid of the protection signal PRGBL to the potential of the write-potential terminal VW by means of the closure of the switch 130 at the first terminal A1. The transistor 32 is programmed independently of the contents of the column latch Z2; all other transistors are switched such that their state does not change.

The subsequent erase cycle takes place depending on the data, i.e., depending on the value that was stored in the column latch. If the transistor 32 is written with a logical 0, the column latch Z2 is loaded with a logical 1. Thus the output of the erase inverter 240 switches the first terminal to the potential of the first supply voltage. The channel of the transistor 32 is likewise pulled to the high-voltage potential and the electrons are pulled away from the floating gate of the transistor 32. Thus the memory cell is erased.

In order to write a logical 1 to the transistor 32, the column latch Z2 is preloaded with a logical 0. Thus the subsequent erase cycle is suppressed after the programming cycle.

During the erase cycle, the erase inverter 240 switches the bit line BL to the potential of the write-potential terminal VW. The potential of the second word line WL2 is at reference potential. The first word line WL1, the third word line WL3, the first, the second and the third well terminals W1, W2 and W3 and the bit lines BL1 and BL3 of the column latches Z1 and Z3 are at the potential of the high voltage. The transistor 32 is thus turned on and forms a channel. The associated bit line BL2 is pulled with the aid of the column latch Z2 to the potential of the write-potential terminal VW. Thus the potential at the channel of the transistor 32 is predetermined. The voltage difference between the second word line WL2, which is at reference potential, and the write-potential terminal VW is too small in this case, so that electrons are not pulled away from the floating gate of the transistor 32. The logical 1 remains stored in transistor 32.

To be able to read data out with the aid of the readout unit AE, the corresponding bit line BL is precharged at the beginning of the readout phase, depending on the implemented technology of the readout unit AE. If a readout cycle is started, then the respective bit lines BL are precharged for a defined time span to a defined voltage. The switch 190 is closed with the aid of the readout signal ALS. The first terminal A1 is connected to the read-potential terminal LP. Thereby the potential of the bit line BL is actively precharged to the potential of the read-potential terminal LP. This advantageously contributes to an acceleration in the readout process.

Figure 3:
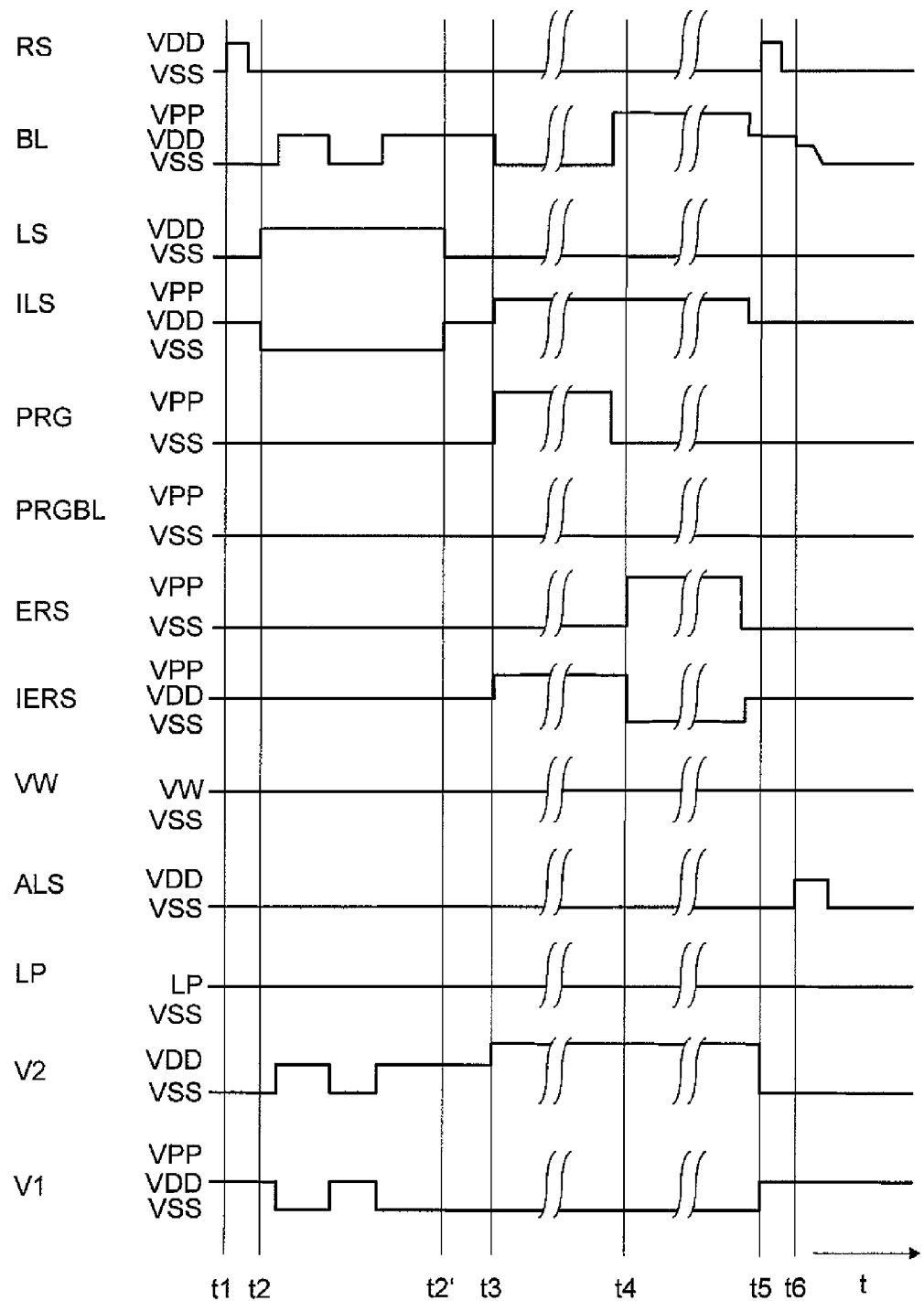
FIG. 3 shows exemplary timing diagrams for the embodiment of FIG. 2.

FIG. 3 shows exemplary timing diagrams for the embodiment of FIG. 2. For each line, the curve of a signal over the time t is represented. From top to the bottom, these are the reset signal RS, the signal on the bit line BL, the load signal LS, the inverted load signal ILS, the programming signal PRG, the protection signal PRGBL, the erase signal ERS, the inverted erase signal IERS, the curve of the signal at the write-potential terminal VW, the readout signal ALS, the curve of the potential at the read-potential terminal LP, the curve of an output signal V2 at the output of the second inverter 110 and the curve of an output signal V1 at the output of the first inverter 100. The digital signal curves can assume the values of the supply-potential terminal VPP, the supply-potential terminal VDD or the value of the reference-potential terminal VSS.

At a point in time t1, the circuit arrangement of FIG. 2 is reset with the reset signal RS. At a point in time t2, a loading phase is started with the aid of the load signal LS and the inverted load signal ILS. The output signal V2 at the output of the second inverter 110 thus follows the signal on the bit line BL. The output signal V1 at the output of the first inverter 100 takes on a curve inverted with respect to this. Towards the end of the loading phase, the supply voltage of the column latch is switched from low voltage to high voltage at a point in time t2', i.e., from the value of the supply-potential terminal VDD to the value of the supply-potential terminal VPP and is thus switched into high-voltage operation. The programming cycle begins at a point in time t3 by switching on the programming signal PRG. For this purpose, the bit line BL is switched to reference potential. The programming cycle takes place independent of the data. At a point in time t4, the erase cycle follows. Since the last element stored in the column latch is a logical 1, as is evident from the output signal V2, the memory cell connected to the bit line BL is erased, under the control of the erase signal ERS and the inverted erase signal IERS. At a point in time t5, there is again a resetting of the circuit arrangement. At a point in time t6, a readout cycle is started with the aid of the readout signal ALS. The potential on the bit line BL is pulled to the value of the reference-potential terminal VSS.

Figure 4:
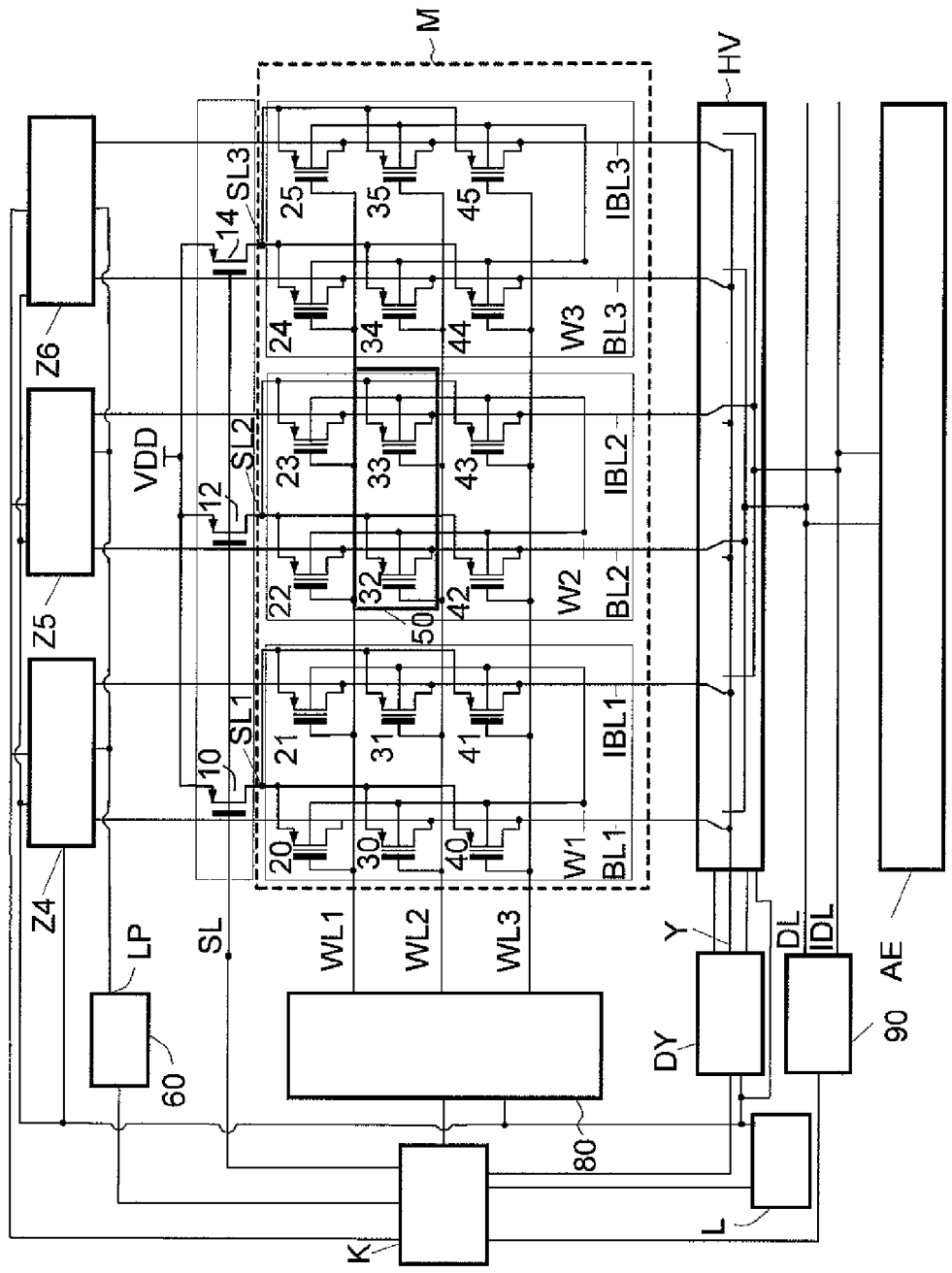
FIG. 4 shows a second embodiment of a nonvolatile memory.

FIG. 4 shows a second embodiment of a nonvolatile memory. This embodiment corresponds to the embodiment of a nonvolatile memory from FIG. 1, but wherein the memory matrix M is constructed differentially. Each data bit is implemented here by two memory cells, i.e., by two transistors. Thus the transistors 21, 31, 41, 23, 33, 43, 25, 35, and 45 are provided. Each control input of the transistors 21, 23 and 25 is connected to the first word line WL1. Each control input of the transistors 31, 33 and 35 is connected to the second word line WL2. Each control input of the transistors 41, 43 and 45 is connected to the third word line WL3. Each well terminal of the transistors 21, 31 and 41 is connected to the first well terminal W1. Each well terminal of the transistors 23, 33 and 43 is connected to the second well terminal W2. Each well terminal of the transistors 25, 35 and 45 is connected to the third well terminal W3. Each source terminal of the transistors 21, 31 and 41 is connected to the first selection line SL1. Each source terminal of the transistors 23, 33 and 43 is connected to the second selection line SL2. Each source terminal of the transistors 25, 35 and 45 is connected to the third selection line SL3. Each drain terminal of the transistors 21, 31 and 41 is connected to a first inverted bit line IBL1. Each drain terminal of the transistors 23, 33 and 43 is connected to a second inverted bit line IBL2. Each drain terminal of the transistors 25, 35 and 45 is connected to a third inverted bit line IBL3. The first, the second and the third inverted bit lines IBL1, IBL2 and IBL3 are each switchably coupled to the output Y of the Y decoder DY. The inverted bit lines IBL1, IBL2 and IBL3 are each additionally connected switchably to an inverted data line IDL at the output of the data driver 90. The inverted data line IDL is further coupled to the readout unit AE.

The column latches Z4, Z5 and Z6 are additionally represented. The column latch Z4 is connected via the first bit line BL1 and via the first inverted bit line IBL1 to the memory matrix M. The column latch Z5 is connected via the second bit line BL2 and via the second inverted bit line IBL2 to the memory matrix M. The column latch Z6 is connected via the third bit line BL3 and the third inverted bit line IBL3 to the memory matrix M.

Figure 5:
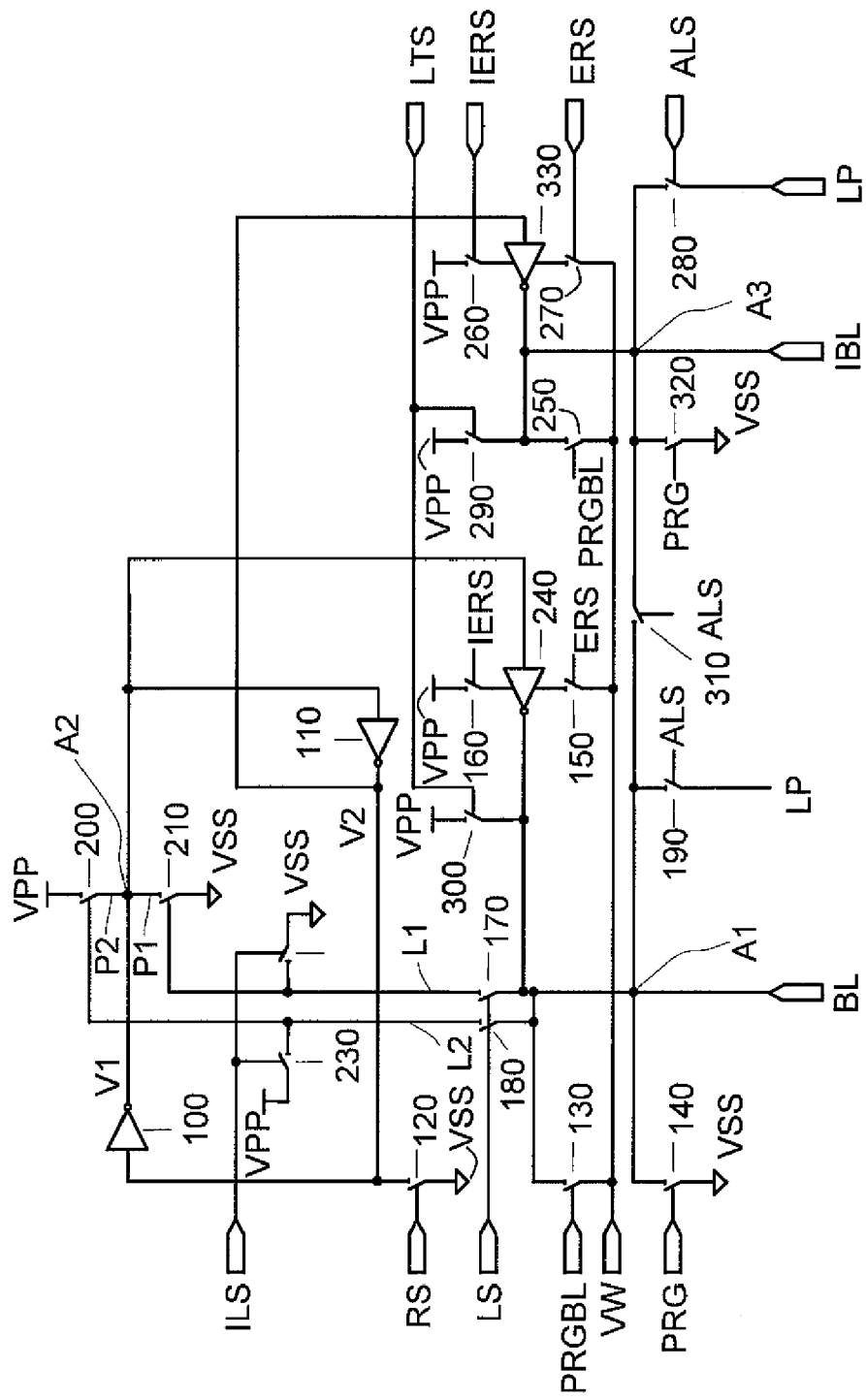
FIG. 5 shows a second example embodiment of a circuit arrangement according to the invention.

FIG. 5 shows a second example embodiment of a circuit arrangement according to the invention. This embodiment is designed for use with a differentially constructed nonvolatile memory as described in FIG. 4, for instance. This embodiment thus corresponds to one of the column latches Z4, Z5 or Z6. The embodiment of the column latch 100, 110 as shown agrees with that of FIG. 2, but with additional elements for operation with a differentially constructed memory being provided. In addition to FIG. 2, this embodiment comprises a third terminal A3, an additional inverter 330, various switches and signal inputs.

The third terminal A3 is designed for connection to an inverted bit line IBL. The inverted bit line IBL can thus be switchably connected to the first, second or third inverted bit line IBL1, IBL2 IBL3 of FIG. 4.

The third terminal A3 is switchably connected via a switch 310, controlled by the readout signal ALS, to the first terminal A1. The third terminal A3 is additionally switchably connected to the reference-potential terminal VSS via a switch 320, controlled by the programming signal PRG. In addition, the third terminal A3 is connected via a switch 280, controlled by the readout signal ALS, to the read-potential terminal LP. With the aid of a switch 250, the third terminal A3 is connected under the control of the protection signal PRGBL to the write-potential terminal VW. Via a switch 290, the third terminal A3 is switchably connected under the control of an erase test signal LTS to the supply-potential terminal VPP. The first terminal A1 is likewise connected via a switch 300, controlled by the erase test signal LTS, to the supply-potential terminal VPP.

An input of the additional inverter 330 is coupled to an output of the second inverter 110. An output of the additional inverter 330 is connected to the third terminal A3. A positive supply terminal of the additional inverter 330 is switchably connected as a function of the inverted erase signal IERS to the supply-potential terminal VPP via a switch 260. A negative supply terminal of the additional inverter 330 is connected via a switch 270, controlled by the erase signal ERS, to the write-potential terminal VW.

The functioning of the column latch 100, 110 will be described for the sake of example in connection with the nonvolatile memory of FIG. 4. A data bit 50 from FIG. 4 that is formed by the transistors 32 and 33 is to be programmed. For programming with a logical 1, the second word line WL2 is switched in the programming cycle to the potential of the supply-potential terminal VPP. The second well terminal W2 is connected to the reference-potential terminal VSS. Thereby electrons are stored at the floating gates of the two selected transistors 32 and 33. The potential of the two associated bit lines BL2 and IBL2 is at the potential of the reference-potential terminal VSS in this case. In the subsequent erase cycle, the second word line WL2 is connected to the reference-potential terminal VSS and the second well terminal W2 to the supply-potential terminal VPP. Both transistors 32 and 33 are in erase configuration. The transistor 32 is not erased, since the associated second bit line BL2 is connected to the write-potential terminal VW. The transistor 33 is erased, since the second inverted bit line IBL2 is connected to the supply-potential terminal VPP.

To store a logical 0 in the data bit 50, the transistor 32 is erased during the erase cycle and the transistor 33 remains unchanged. In each case one of the two transistors is erased and the other is programmed. All the other transistors in the memory matrix M are protected from an undesired programming and erasing with the aid of the protection signal PRGBL.

As is evident from FIG. 5, the actual column latch 100, 110 is not duplicated. The additional, above-described circuit components generate the necessary potentials for the various operating states on the inverted bit line IBL. The switches 280 and 310 are provided to accelerate the readout. If the readout signal ALS is present, the switches 190, 310 and 280 are therefore closed. Thus both the bit line BL and the inverted bit line IBL are short-circuited and connected to the write-potential terminal LP. The potentials of the bit line BL and the inverted bit line IBL are thereby advantageously pulled in an accelerated manner to the potential of the reference-potential terminal VSS or to the potential of the supply-potential terminal VDD, respectively.

The erase test signal LTS and the switches 290 and 300 are provided in order to be able to check the data-holding capability of the memory cells in the differential memory of FIG. 4. Since the differential memory from FIG. 4 has two memory elements, i.e. two transistors, for each data bit, both memory elements can be programmed, but only one memory element can be erased, depending on the data item in the column latch. In order to be able to check the data-holding capability, it is necessary to erase both memory cells independent of the memory content of the column latch. To erase both memory cells, both the bit line BL and inverted bit line IBL are pulled to the potential of the supply-potential terminal VPP with the aid of the erase test signal LTS. In this special erase mode, both the erase signal ERS and the inverted erase signal IERS are suppressed. Thereby the outputs of the erase inverter 240 and the additional inverter 330 become high-impedance.

The unpowered circuit is artificially aged for a defined period of time at a very high temperature in a climatic test cabinet in order to check the data-holding capability of the memory cells. The insulation of the floating gates of the transistors in the memory matrix M is tested by the high temperature. At a high temperature, the charge carriers at the floating gate absorb energy and can more easily leave the floating gate through weak spots in the insulation. If the floating gate loses too many charge carriers, the readout unit AE can no longer correctly decide whether the memory element was erased or programmed. Depending on the memory cell technology that is used, either programmed or erased memory cells are more susceptible for the test of data-holding capability. In this example, the test is conducted with erased memory cells. The test is equally suited for testing two programmed memory cells.

Figure 6:
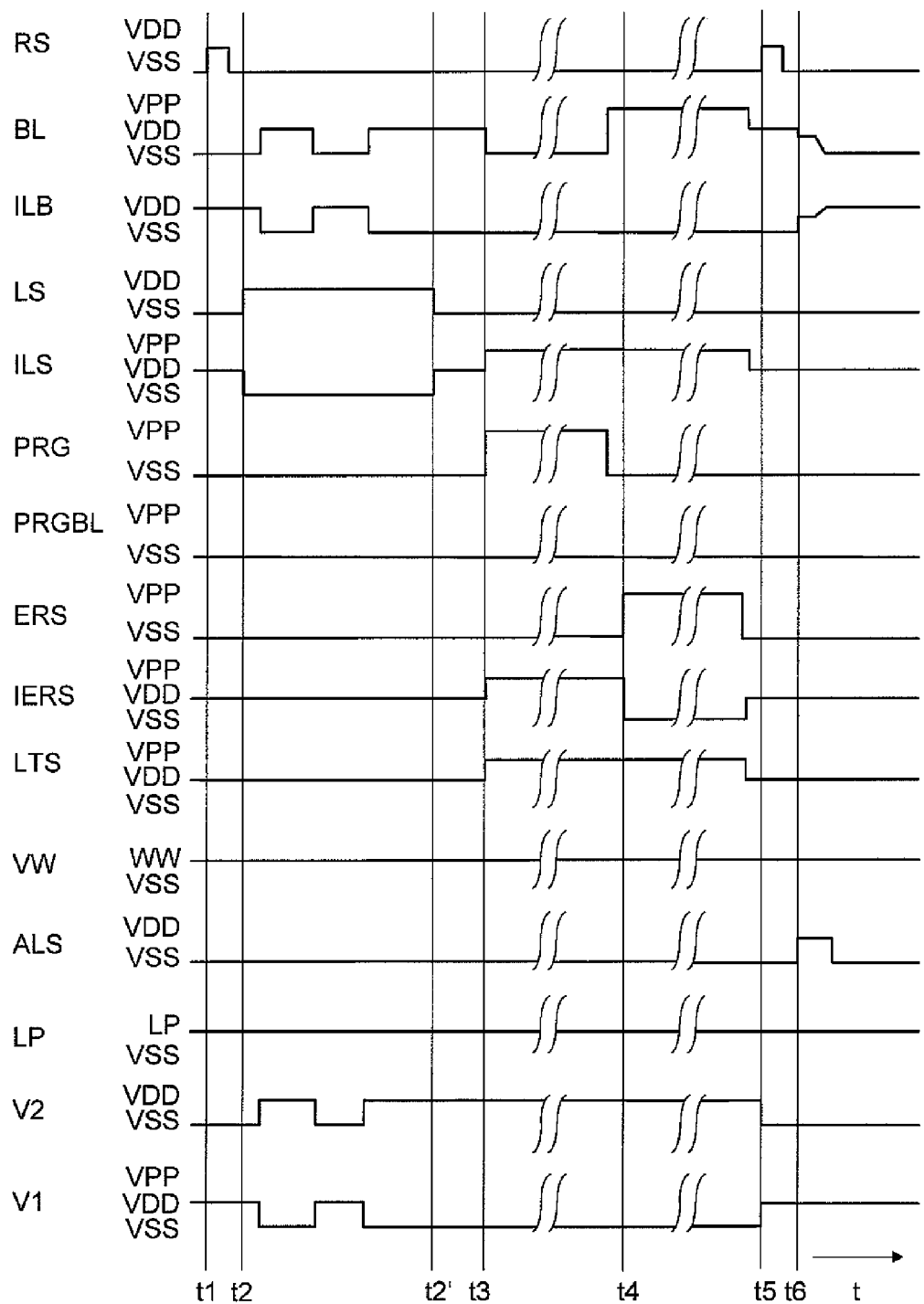
FIG. 6 shows exemplary timing diagrams for the embodiment of FIG. 5.

FIG. 6 shows exemplary timing diagrams for the embodiment of FIG. 5. Corresponding to FIG. 3, the signals are represented one above another relative to the time t. In addition to FIG. 3, the curve of the erase test signal LTS and the inverted bit line IBL are represented. The sequence corresponds to the sequence described in FIG. 3. At time t1, the column latch is reset by means of the reset signal RS. At time t2, the column latch is loaded, initiated by the load signal LS and the inverted load signal ILS. At time t2', there is a changeover from the low-voltage range to the high-voltage range with the aid of the charge pump L. This affects a respective supply voltage of the first and second inverters 100, 110, as well as of the erase inverter 240 and the additional inverter 330. The data-independent programming cycle begins at time t3. The data-dependent erase cycle follows at time t4. At time t5, there is again a reset with the aid of the reset signal RS. A readout process is started at time t6 with the aid of the readout signal ALS.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

We claim:

1. A circuit arrangement comprising:
   a first terminal for connection to a bit line of a nonvolatile memory cell;
   a second terminal connected via a first switchable path to a reference-potential terminal and via a second switchable path to a supply-potential terminal; and
   a column latch coupled to the second terminal and configured to store a potential at the second terminal;
   wherein the first terminal is coupled to the second terminal via a first switchable connection and via a second switchable connection.

2. The circuit arrangement according to claim 1, wherein the first and second switchable connections are switchable without current as a function of a load signal.

3. The circuit arrangement according to claim 2, wherein each of the first and second switchable paths is simultaneously switchable without current one of in a presence of the load signal, depending on a potential at the first terminal to load a value corresponding to the potential at the second terminal into the column latch and in a presence of an inverted load signal to hold a last loaded value in the column latch.

4. The circuit arrangement according to claim 1, wherein the first terminal is connected via a third switchable connection to a read-potential terminal for recharging the bit line as a function of a readout signal.

5. The circuit arrangement according to claim 1, wherein the column latch is switchably coupled for a reset to the reference-potential terminal as a function of a reset signal.

6. The circuit arrangement according to claim 1, wherein the first terminal is switchably coupled to the reference-potential terminal as a function of a programming signal and is configured to program the nonvolatile memory cell.

7. The circuit arrangement according to claim 1, wherein the first terminal is switchably coupled via an erase inverter to the second terminal as a function of an erase signal and an inverted erase signal, and is configured to erase the nonvolatile memory cell as a function of a potential at the first terminal.

8. The circuit arrangement according to claim 1, wherein the column latch comprises a first inverter and a second inverter, wherein an output of the first inverter is connected to the second terminal and to an input of the second inverter, and wherein an output of the second inverter is connected to an input of the first inverter.

9. The circuit arrangement according to claim 8, further comprising:
   a third terminal switchably connected via an additional inverter to the output of the second inverter, switchably coupled to the first terminal, and configured to connect an inverted bit line of a differentially constructed nonvolatile memory cell.

10. The circuit arrangement according to claim 9, wherein the third terminal is switchably connected as a function of a readout signal to a read-potential terminal and switchably connected to the first terminal, and is configured to recharge the inverted bit line.

11. The circuit arrangement according to claim 9, wherein the third terminal is switchably coupled to the reference-potential terminal as a function of a programming signal, and is configured to program the nonvolatile memory cell.

12. The circuit arrangement according to claim 9, wherein the third terminal is coupled via the additional inverter to the second terminal as a function of an erase signal and an inverted erase signal, and is configured to erase the nonvolatile memory cell as a function of a potential at the third terminal.

13. The circuit arrangement according to claim 9, wherein the first terminal and the third terminal are each switchably connected as a function of an erase test signal to the supply-potential terminal.

14. A method for operating a column latch, comprising the steps of:
   applying a potential of a bit line of a nonvolatile memory cell to a first terminal;
   supplying a load signal;
   switching on a first and a second switchable connection without current;
   switching on a first or a second switchable path without current as a function of a potential present at the first terminal;
   connecting the column latch without current as a function of the potential present at the first terminal to a first supply-potential terminal or a reference-potential terminal;
   switching off the load signal;
   supplying an inverted load signal;
   switching off the first and the second switchable connections;
   switching off the first and the second switchable path; and
   holding a potential last present at the first terminal.

15. The method according to claim 14, further comprising:
   supplying a readout signal;
   switching on a third switchable connection between the first terminal and a read-potential terminal; and
   recharging the potential present at the first terminal to a potential of the read-potential terminal.

\* \* \* \* \*